US008010920B2

(12) United States Patent
Bartolotti et al.

(10) Patent No.: US 8,010,920 B2
(45) Date of Patent: Aug. 30, 2011

(54) CONSTRAINT MANAGEMENT AND VALIDATION FOR TEMPLATE-BASED CIRCUIT DESIGN

(75) Inventors: Richard L. Bartolotti, San Jose, CA (US); Thomas D. Burd, Fremont, CA (US); Brian D. McMinn, Buda, TX (US); William A. McGee, San Jose, CA (US); Arun Chandra, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 313 days.

(21) Appl. No.: 12/333,050

(22) Filed: Dec. 11, 2008

(65) Prior Publication Data

US 2010/0153893 A1 Jun. 17, 2010

(51) Int. Cl.
G06F 9/455 (2006.01)

(52) U.S. Cl. .................... 716/106; 716/104; 716/111

(58) Field of Classification Search .................. 716/104, 716/106, 111
See application file for complete search history.

(56) References Cited

U.S. PATENT DOCUMENTS

| | | | | |
|---|---|---|---|---|
| 6,813,201 | B2 * | 11/2004 | Zarrineh et al. | 365/201 |
| 7,345,511 | B2 * | 3/2008 | Morgenshtein et al. | 326/122 |
| 2002/0073380 | A1 * | 6/2002 | Cooke et al. | 716/1 |
| 2008/0082946 | A1 * | 4/2008 | Zilic et al. | 716/5 |

OTHER PUBLICATIONS

Andreas Kuehlmann et al., "Verity—a Formal Verifaction Program for Custom CMOS Circuits," Published in the IBM Journal on Research and Development, Jan. 1995.
Lawrence T. Pillage et al., "Asymptotic Waveform Evaluation for Timing Analysis," IEEE Transactions on Computer-Aided Design, vol. 9, No. 4, Apr. 1990.
Randal E. Bryant, "Graph-Based Algorithms for Boolean Function Manipulation," Update of originally published IEEE Transactions on Computers, C-35-8, pp. 677-691, Aug. 1986.
Arun Chandra et al., "Practical Considerations in formal Equivalence Checking of Power PC1 Microprocessors," IEEE 8th Great Lakes Symposium on VLSI, Jan. 1998.
Harry Foster et al., "Introduction to the New Accellera Open Verification Library," DVCON Jan. 2006.

* cited by examiner

*Primary Examiner* — Paul Dinh
*Assistant Examiner* — Brian Ngo

(57) ABSTRACT

A technique for constraint management and validation for template-based device designs is disclosed. The technique includes generating a template-level representation of an electronic device design based on a transistor-level representation of the electronic device design. The template-level representation includes one or more hierarchies of templates. Each template represents a corresponding portion of the electronic device design. The technique further includes determining constraint declarations associated with the electronic device design and verifying whether there is a functional equivalence between the template-level representation to a register-transfer-level (RTL) representation of the electronic device design. The technique additionally includes verifying whether the constraint declarations are valid and verifying the electronic device design responsive to verifying the functional equivalence and verifying the constraint declarations.

20 Claims, 4 Drawing Sheets

CONSTRAINT MANAGEMENT AND VALIDATION FOR TEMPLATE-BASED CIRCUIT DESIGN

FIELD OF THE DISCLOSURE

The present disclosure relates generally to integrated circuits, and more particularly, to the design and verification of integrated circuits.

BACKGROUND

Modern data processing integrated circuit (IC) devices often include hundreds of millions of transistors. A typical design team can include hundreds of engineers and the effort to advance an IC device from conception to manufacturing can encompass years. Design productivity is a major factor for these increasingly complex IC devices to meet marketing schedules. Computer-aided design (CAD) tools can provide automation of some design processes, and additional computer resources also can improve productivity by reducing the time required to perform specific tasks. The greatest source of increased design productivity can be realized in the realm of design methodology.

Design methodologies have generally progressed from processes conducted at the transistor level to processes involving standardized library components. Library-based methodologies cannot always provide the same level of performance, power efficiency, and device area efficiency that can be realized using transistor-level techniques. Therefore, design methodologies often support both library and transistor development systems using highly disparate CAD tools and design verification systems. Developing and supporting multiple design tool platforms is costly, and can lead to deficiencies in the overall functional and electrical verification process due to inherent incompatibilities of the two verification systems.

BRIEF DESCRIPTION OF THE DRAWINGS

The present disclosure may be better understood, and its numerous features and advantages made apparent to those skilled in the art by referencing the accompanying drawings.

DETAILED DESCRIPTION

An electronic device design process, such as an integrated circuit design process, typically includes the generation of a register-transfer level (RTL) representation (description) of the desired electronic device design. The RTL representation can serve as a specification of the electronic device design and as a functional model of the electronic device design that can be verified using formal and simulation-based verification procedures. Design-implementation engineers convert the functions specified by the RTL representation into circuits that are a transistor representation of the electronic device design using logic design and circuit design techniques. Circuits typically have specific functional and electrical requirements that must be met in order for the circuit to operate correctly. These requirements are referred to as constraints or assertions. The design process can initially rely on the assumption that the constraints are satisfied, but the design process eventually should verify that each and every constraint is in fact valid. A method is disclosed wherein functional and electrical verification is conducted using a unified process. This unified process provides for variation in the implementation or construction process where such variety offers a productivity advantage, while providing a unified verification process to increase the quality of the overall verification effort. The use of a unified verification process is especially beneficial with regard to constraint management and constraint verification.

Figure 1:
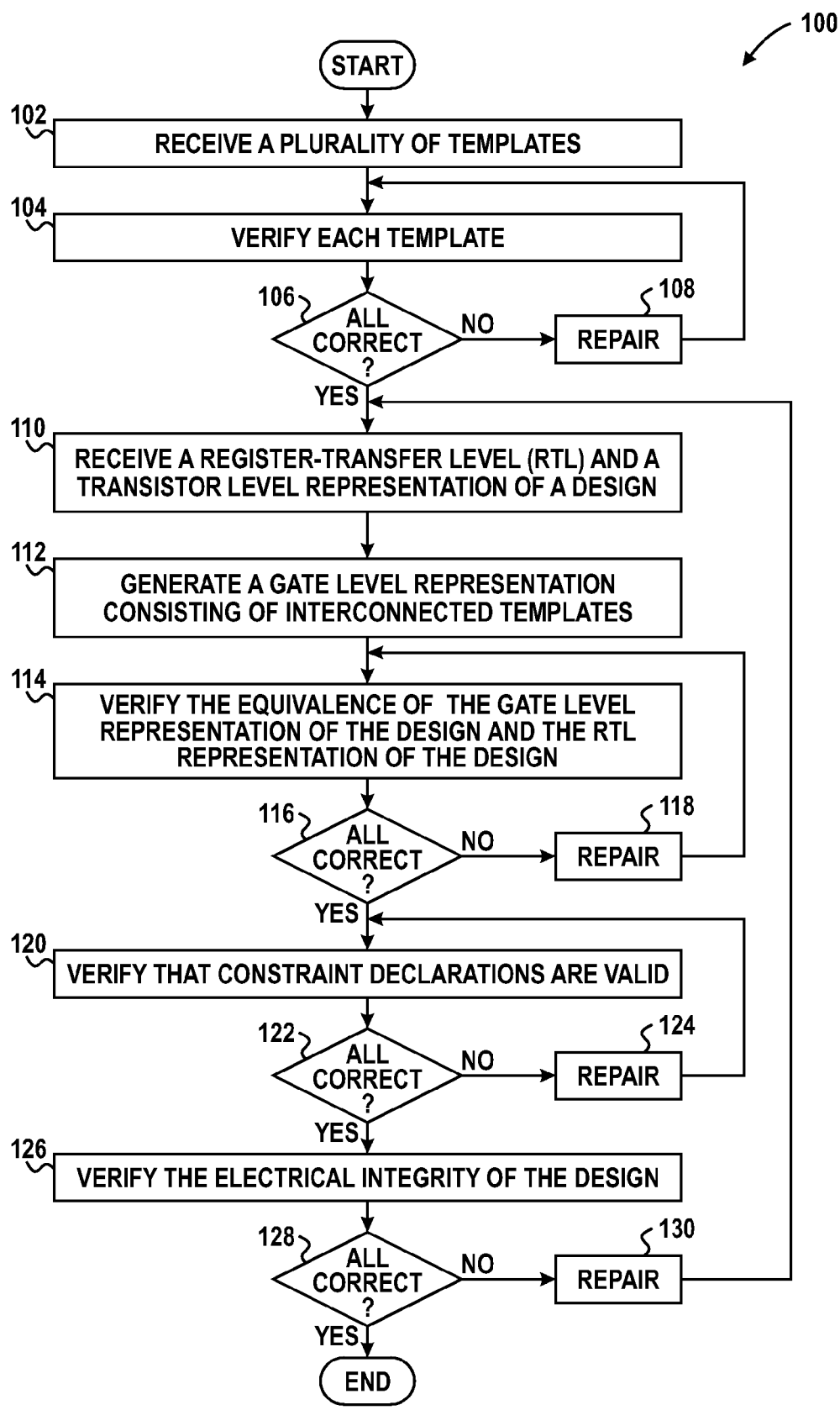
FIG. 1 is a flow diagram illustrating a method of verifying an electronic device design in accordance with a specific embodiment of the present disclosure.

FIG. 1 is a flow diagram illustrating a method 100 of verifying an electronic device design in accordance with a specific embodiment of the present disclosure. A designer using a design verification system performs method 100. The design verification system includes a design file that stores an evolving representation of the electronic device design, and design tools that evaluate and further develop the electronic device design. The design file includes a library of templates that the designer uses to represent the electronic device design. At block 102, the designer retrieves the template library from the design file for verification. Each template includes a gate representation (a single component representing the template), a corresponding transistor-level representation (the particular configuration of interconnected transistors), and template properties that can include constraint declarations and a functional description of the template. The functional description of the template specifies the operation of the template using a functional modeling language such as Verilog.

At block 104, the designer verifies the equivalence of the functional description and the transistor-level representation of each template. The verification process conducted at block 104 includes a combination of functional and transistor-level simulation techniques. An automated template verification tool applies static and sequential stimulus to the functional and transistor-level representation of each template and compares the responses of each representation to make sure that each representation provides the same response. For example, functional behavior of the functional representation of the template can be evaluated using a logic simulator such as VCS provided by Synopsys, Inc., and behavior of the transistor-level representation of the template can be modeled using a transistor simulator such as HSPICE. The template verification tool assumes that all constraint declarations are true while performing the verification procedure.

At decision block 106, the designer determines whether any templates failed the verification procedure of block 104. If a template failed the verification procedure, the flow progresses to block 108 where deficiencies in the failing template are corrected. A failure may indicate an improper transistor-level implementation of the template function, an incorrect functional description of the template function, or both. The flow returns to block 104 where the failing templates are again verified. If all templates are verified to be equivalent, the flow progresses to block 110, where a RTL and a transistor-level representation of an electronic device design are retrieved from the design file. Both representations can include additional constraint declarations.

At block 112, a classification procedure generates a gate-level representation of the electronic device design from the transistor-level representation, where the gate-level representation includes interconnected templates. The classification process uses a graph-matching technique to map respective portions of the transistor-level representation of the electronic device design to corresponding templates. The template-mapping algorithm can be based on the graph isomorphism algorithms of Schmidt-Druffel, Ullman, VF, or the like. The template-level representation of the electronic device design will include only references to templates and will not include references to unclassified transistors. The template-level representation is typically hierarchical and can reflect functional and structure partitions of the electronic device design. The classification process is further described with reference to FIGS. 2 and 3. For the purpose of discussion, the template-level representation of the electronic device design is a type of gate-level representation, and the terms are synonymous.

At block 114, the designer verifies the equivalence of the gate-level representation and the RTL representation of the electronic device design. The verification process of block 114 includes formal techniques where an automated-design tool provides a formal proof using an abstract mathematical model of the electronic device design. An example of a commercial formal verification tool is LEC from Cadence Design Systems, Inc. The verification process of block 114 may also include simulation-based verification techniques where a co-simulation design tool provides stimulus to the RTL and gate representation of the electronic device design and the response of each representation is compared for equivalence. An example of a commercial RTL simulation tool useful for this purpose is VCS from Synopsys, Inc. The functional verification process performed at block 114 can monitor for violations of constraint declarations that are encountered, but the validity of a constraint declaration is not proven during the verification process of block 114.

At decision block 116, it is determined whether the verification procedure at block 114 successfully determined that the RTL and gate-level representations of the electronic device design are equivalent. If the verification process at block 116 identifies an inconsistency between the operation of the RTL representation and the gate-level representation of the electronic device design, the flow proceeds to block 118 where the designer identifies the source of the error and makes corrections to the RTL representation, the transistor representation, or both. The flow returns to block 114 where the designer verifies that the RTL and gate-level representations of the electronic device design are equivalent. The flow proceeds to block 120 where the designer verifies the validity of all constraint declarations. The verification process at block 120 can include the use of an automated assertion-checking (proof engine) CAD application that provides a formal proof of each constraint, or another verification technique can be used. An example of a commercially available formal assertion checker is 0-In from Mentor Graphics Corporation. Constraint declarations associated with the RTL representation are typically verified using the corresponding RTL representation of the electronic device design, while constraint declarations associated with the templates and the transistor-level representation are verified using the corresponding gate-level representation of the electronic device design.

At decision block 122, the designer determines whether the procedure at block 120 has verified all constraint declarations. If the verification process at block 120 identifies a particular constraint declaration that is not proven to be true, the flow progresses to block 124 where additional verification techniques can be used to confirm the validity of each unproven constraint declaration. Simulation techniques typically are used when formal techniques are unable to prove the validity of a constraint declaration assertion. Stimulus can be prepared that is specifically directed towards the exercising of particular portions of the electronic device design. One can refer to such stimulus as a test pattern, and the test pattern can include a sequence of instructions that the electronic device design executes in the context of a simulation design-tool. The flow returns to block 120 where the designer confirms that all constraints are valid.

If the verification process of block 120 determines that all constraint declarations are true, the flow proceeds to block 126 where the designer verifies the electrical integrity of the electronic device design. Verification of electrical integrity can include timing analysis to determine if the manufactured electronic device will operate at a specified frequency, and other verification procedures that identify functionality defects and reliability concerns. Examples of types of electrical integrity verification includes noise analysis, thermal analysis such as local heating analysis, resistive voltage drop (IR) analysis, electro-migration (EM) analysis, and electrical design rule checks such as verification of beta ratio and other electrical and physical-design policies. Because the designer has previously proven that all constraint declarations are valid, the electrical verification procedures make use of the constraint declarations to control and limit electrical analysis. Note that the order of the verification processes described at blocks 114, 120, and 126 of method 100 can be performed in another order, or can be performed in parallel.

If the designer identifies an electrical failure, the flow proceeds to block 130 where the designer modifies the electronic device design to correct the failure. For example, if timing simulations identify a particular circuit that fails to operate at a specified frequency, the designer can provide an alternate circuit implementation, or adjust the sizes of individual transistors. If electro-migration analysis determines that excessive current is flowing in a particular conductor, the designer can widen the layout representation of the conductor. The flow returns to block 110 where the modified device design is once again classified and the process continues anew. The described procedure can be implemented to operate on portions of the electronic device design by appropriate partitioning of device functions in to corresponding portions.

Figure 2:
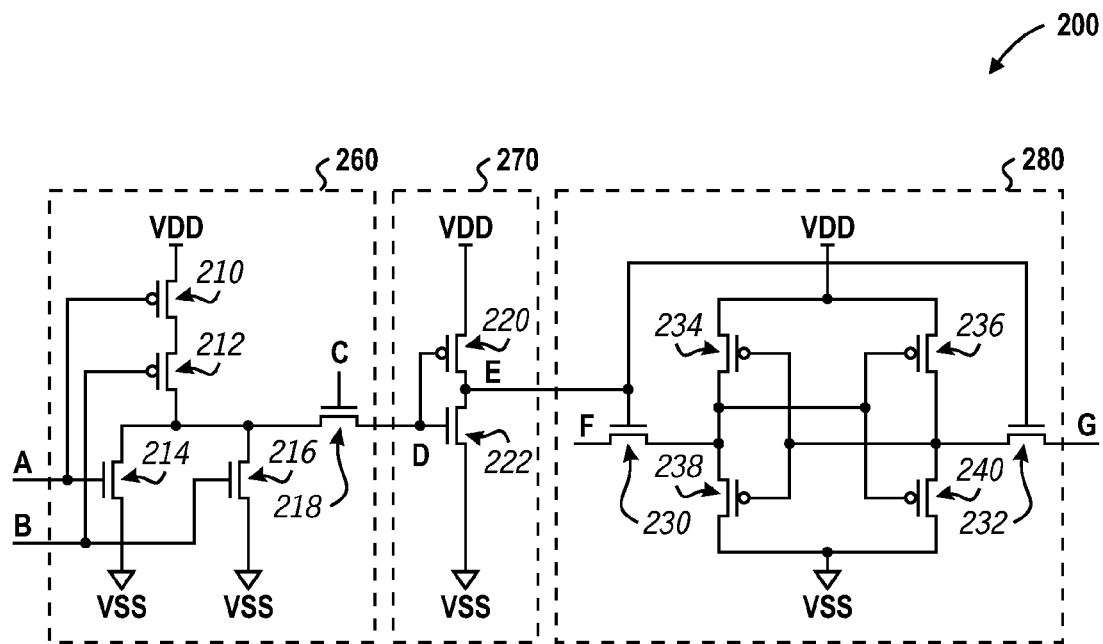
FIG. 2 is a diagram illustrating a transistor-level representation of a portion of an electronic device design in accordance with a specific embodiment of the present disclosure.

FIG. 2 illustrates in schematic form a transistor-level representation 200 of a portion of an example electronic device design in accordance with a specific embodiment of the present disclosure. The example electronic device design includes p-type transistors 210, 212, 220, 234, and 236, n-type transistors 214, 216, 218, 222, 230, 232, 238, and 240, and resistors 234 and 236. Transistor-level representation 200 is further divided into portions 260, 270, and 280. Portion 260 includes transistors 210, 212, 214, 216, and 218. Portion 270 includes transistors 220 and 222. Portion 280 includes transistors 230, 232, 234, 236, 238, and 240.

Transistor 210 has a source connected to node VDD, a gate connected to a node labeled "A," and a drain. Transistor 212 has a drain connected to the source of transistor 210, a gate connected to a node labeled "B," and a source. Transistor 214 has a drain connected to the source of transistor 212, a gate connected to node A, and a source connected to node VSS. Transistor 216 has a drain connected to the source of transistor 212, a gate connected to node B, and a source connected to node VSS. Transistor 218 has a first drain/source (D/S) terminal connected to the drain of transistor 216, a gate connected to a node labeled "C," and a second D/S terminal connected to a node labeled "D."

Transistor 220 has a source connected to node VDD, a gate connected to node D, and a drain connected to a node labeled "E." Transistor 222 has a drain connected to node E, a gate connected to node D, and a source connected to node VSS. Transistor 230 has a first D/S terminal connected to a node labeled "F," a gate terminal connected to node E, and a second D/S terminal. Transistor 232 has a first D/S terminal connected to a node labeled "G," a gate terminal connected to node E, and a second D/S terminal. Transistor 234 has a source connected to node VDD, a gate connected to the second D/S terminal of transistor 232, and a drain connected to the second terminal of transistor 230. Transistor 236 has a source connected to node VDD, a gate connected to the second D/S terminal of transistor 230, and a drain connected to the second D/S terminal of transistor 232. Transistor 238 has a drain connected to the second terminal of resistor 234, a gate connected to the second terminal of resistor 236, and a source connected to node VSS. Transistor 240 has a drain connected to the second terminal of resistor 236, a gate connected to the second terminal of resistor 234, and a source connected to node VSS.

Transistor-level representation 200 represents a portion of an electronic device design and illustrates the classification process at block 112 at FIG. 1. The classification process generally includes identifying channel-connected transistors, and matching particular interconnected transistor topologies to a template that has a matching topology. For example, transistors 210, 212, 214, 216, and 218 comprise a channel-connected group of transistors, as do transistors 220 and 222. The topological connectivity of each of these groups of transistors typically corresponds to a particular template.

A template can also represent a combination of two or more channel-connected groups of transistors and may include other devices such as resistors, capacitors, and diodes. A template typically includes more than one channel-connected group of devices when combining of multiple groups is required to define either a basic logic function or a basic timing element. For example, transistors 230, 232, 234, 236, 238, and 240, representing two channel connected groups of devices, can together be associated with a single template, which represents a latch function. The classification process generally is an automated procedure performed by the system, but the designer can guide the classification process by providing guidance that may reduce the time needed to classify a transistor-level representation into a corresponding gate-level representation. A resistor (not shown) is included with a respective channel-connected group if the resistor is connected to a drain or source of a transistor of the corresponding channel-connected group.

Figure 3:
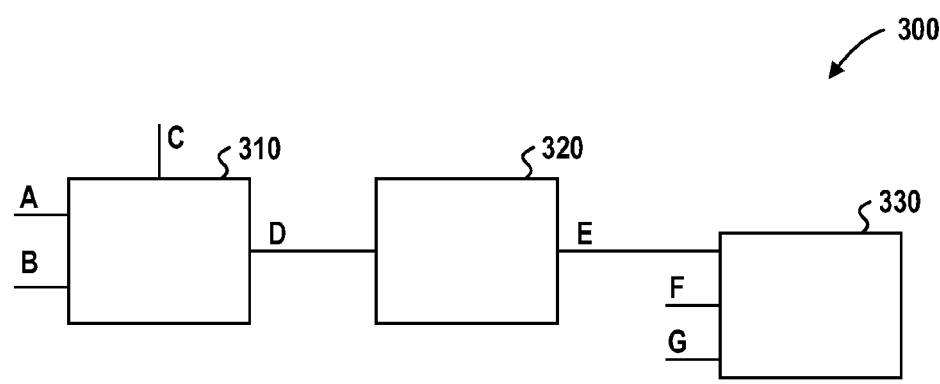
FIG. 3 is a diagram illustrating a template-level representation of the electronic device design portion of FIG. 2 in accordance with a specific embodiment of the present disclosure.

FIG. 3 illustrates in schematic form a template-level representation 300 of the electronic device design portion of FIG. 2 in accordance with a specific embodiment of the present disclosure. Template-level representation 300 includes templates 310, 320, and 330, and nodes A, B, C, D, E, F, and G. Template 310 has terminals connected to nodes A, B, C, and D. Template 320 has a terminal connected to node D and Node E. Template 330 has a terminal connected to nodes E, F, and G.

Template 310 is associated with the particular interconnection of five transistors and four terminal connections. The structure of the interconnected transistors and terminals is thus equivalent to template 310. The classification process identifies a match between template 310 and the corresponding interconnectivity of transistors 210, 212, 214, 216, and 218 and associated nodes A, B, C, D, power, and ground (portion 260 at FIG. 2). A template, such as template 310, can have properties associated with specific ports, nets, and transistors that are used by analysis and verification tools. Furthermore, the template can be associated with a functional description, such as a model described using the Verilog language or another behavioral-description syntax. For example, the functional description of template 310 may include the logical expression that a signal provided at node D is equal to the logical NOR function of signals received at nodes A and B, so long as the signal provided to node C is at a logic-high level. The functional description would also describe the behavior of the template when the signal provided to node C is at a logic low level.

Template 320 is associated with the particular interconnection of two transistors and two terminal connections. The classification process identifies a match between template 320 and the corresponding interconnectivity of transistors 220 and 222, and associated nodes D, E, power, and ground (portion 270 at FIG. 2). The logical function performed by the circuit represented by template 270 is an inversion, where E=not(D). Template 330 is associated with the particular interconnection of four transistors comprising two channel-connected groups of devices. The classification process identifies a match between template 330 and the corresponding interconnectivity of transistors 230, 222, 238, and 240, resistors 234 and 236, and associated nodes E, F, G, power, and ground (portion 280 at FIG. 2). Properties associated with template 330 describe the functional latch-behavior of the corresponding circuit, and can include a constraint specifying that the signals received at nodes F and G must be at a different logic level when the signal provided at node E is at a logic-high level.

A template also can be associated with one or more constraint declarations. A constraint declaration can be used to restrict analysis and testing of the circuit associated with a template to only those conditions where the template operates correctly. Conditions under which the behavior of a circuit corresponding to the template are indeterminate, or conditions that can result in damage to the circuit, are identified by constraints that assert that such conditions are illegal. An example of a constraint is an assertion that only one select-control input of a multiplexor circuit should be active at the same time. The correct operation of the multiplexor circuit cannot be assured if the constraints associated with the multiplexor template are not observed. During electrical verification of the electronic device design, two or more select-control inputs of the multiplexor will never be asserted at the same time. The validity of the constraint should be confirmed using the gate-level representation of the device design. Thus, functional and electrical verification is performed with the assumption that all constraints are valid, but the validity of each constraint should be independently verified.

Constraints associated with templates and the transistor-level device design representation can be divided into categories, such as static constraints, transition constraints, and temporal constraints. Each constraint refers to a characteristic of a signal at a particular node, or a relationship between signals at specified corresponding nodes. Static constraints define the legal or illegal states that a collection of signals can represent. A transition constraint defines how or whether two or more signals are permitted to transition simultaneously. A temporal constraint defines the legal or illegal state transitions permitted for a collection of signals.

Examples of static constraints include: 1) EXCME, to declare that signals at two nodes are mutually exclusive, 2) ONEHOT, to declare that signals at only one node of three or more nodes can be at a logic-high level at the same time, 3) ONECOLD, to declare that signals at only one node of three or more nodes can be at a logic-low level at the same time, 4) ZEROHOT, to declare that two or more nodes can have only zero or one signal at a logic-high level at the same time, 5) ZEROCOLD, to declare that two or more nodes can have only zero or one signal at a logic-low level at the same time, 6) EQUIV, to declare that signals at two or more nodes are logically equivalent, 7) EXCUBE, to declare illegal states specified with reference to a group of signals at two or more nodes, and 8) COR, to declare legal states specified with reference to a group of signals at two or more nodes. Note that static constraint EXCME is a special case of static constraint ONESHOT where the relationship between only two nodes is declared.

Transition constraints are constraints generated using timing analysis tools. Examples of transition constraints includes 1) EXCU, to declare that signals at two nets cannot transition up at the same time, 2) EXCD, to declare that signals at two nets cannot transition down at the same time 3) EXCUD, to declare that signals at two nets cannot transition up or down at the same time, and 4) EXMAT, to declare that specific signal transition combinations are excluded. An example of a temporal constraint includes PRECHG, which is used to identify a pre-charge node. Temporal constraints can be used to assure correct behavior of dynamic logic, such as domino-circuits, during the pre-charge and the evaluate phases of operation. The preceding examples are intended to illustrate particular types of constraints, and skilled artisans will appreciate that other constraints may be used when necessary to describe or restrict permissible operation of a particular circuit without departing from the scope of the present disclosure.

Constraints can be associated with the RTL representation or the transistor-level representation of the electronic device design, or with individual templates. A constraint associated with the RTL representation are classified as assumed constraints and are typically applied to signals that interface between two logic blocks. Constraints associated with the transistor-level description of the device design are assumed constraints, and can be specified by a circuit design engineer. Constraints associated with a template are assumed constraints that describe a relationship between template inputs, or true constraints that describe a relationship between template inputs and outputs. A true constraint is known to be valid based on the structure of the template. For example, signals at the input and output of an inverter are known to be mutually exclusive. Constraints originating at different locations in the design process that are described in disparate syntaxes can be converted into a unified syntax, such as the Accellera Open Verification Library (OVL) syntax.

Constraints can be used during functional verification, electrical verification, and constraint verification. Constraints used during functional verification to verify the equivalence of the RTL and template-level representation of the electronic device design are primarily associated with the RTL representation. Constraints can be associated with the RTL representation of an electronic device design for a variety of purposes. For example, a designer can associate a constraint with the RTL representation of the electronic device design to assert that a signal used to flush a data cache should not be activated if status information associated with any cache entry indicates that the particular entry has not been written-back to memory. If this constraint is violated during functional verification of the electronic device design, either the RTL representation or the transistor-level representation of the electronic device design, or both, should be corrected.

Constraints used during electrical verification of the electronic device design are primarily constraints associated with templates, but can also be sourced from the RTL and transistor-level representations of the electronic device design. Electrical verification is performed to assure that the electronic device operates correctly and reliably over the device's expected operating lifetime. Electrical verification can include individual procedures directed at particular sources of failure, such as timing analysis, noise analysis, thermal analysis, signal integrity analysis, electro-migration analysis, electrical design-rule analysis, and the like. For example, electrical design-rule verification checks can be written to identify circuit nodes that are not properly driven, such as node D at FIG. 2.

Each analysis procedure can use constraint declarations to describe or limit behavior of specific signals. For example, the EXCD constraint that specifies that signals at two nodes are not capable of transitioning to a logic-low value simultaneously can be used by a noise analysis procedure to determine that the two nets will not simultaneously aggress against a common victim node. The EXCD constraint can also be used by a IR analysis procedure to declare that the gates of two NMOS devices can not turn on at the same time, which could result in excessive resistive voltage-drop at a third node.

The EXCME constraint can be used specify that two signals are mutually exclusive. A current-density analysis procedure may use this information to determine that two transistors can not be activated at the same time, and thus excessive current can not be carried by a particular circuit interconnect metallization layer. The EXCME constraint can be used to perform effective-width calculations to perform fan-out, beta-ratio, feedback ratio, and similar electrical design-rule verification. Furthermore, the EXCME constraint can be used to eliminate false-paths during timing analysis and during calculation of an effective-hold resistance. The ONEHOT constraint can be used during noise analysis to not only declare that two or more signals are mutually exclusive and therefore can not aggress simultaneously against a victim node, but to direct the analysis tool to perform the noise calculation using the worst noise source from among the nodes bound by the exclusion. Static, transition, and temporal constraints can be used by the electrical verification procedures in any way necessary to describe valid electrical and functional behavior of a signal or a group of signals at respective circuit nodes.

Constraints can be assumed to be valid during functional verification of the electronic device design to identify specific functional relationships that are necessary for correct operation. Similarly, constraints can be assumed valid during electrical verification of the electronic device design to correctly describe and limit behavior of signals. Constraints can be used during electrical verification to limit unnecessary over-design. However, the validity of all constraints should be thoroughly verified.

Each constraint has an associated status property, which can include values of assumed, true, proven, false, or propagated. An assumed status value is initially assigned to a constraint in order to make forward progress. It should be proven at a later time. A true status is a constraint that is true. For example, a constraint asserting that the logic-level provided at the output of an inverter is always the inverse of the logic-level received at its input is always true. A proven constraint is a constraint that was initially assumed, and has been subsequently proven to be true by a constraint verification procedure. A false constraint is a constraint that was initially assumed, and has been subsequently proven to be false by a constraint verification procedure. A propagated constraint is a constraint that was initially assumed, and has since been proven true by virtue of being propagated by the classification process.

During constraint verification procedures, all constraints should eventually assume a status value of true, proven, or propagated. A constraint that is determined to be false indicates a defect in the electronic device design and must be corrected, and all analysis steps should then be repeated.

Figure 4:
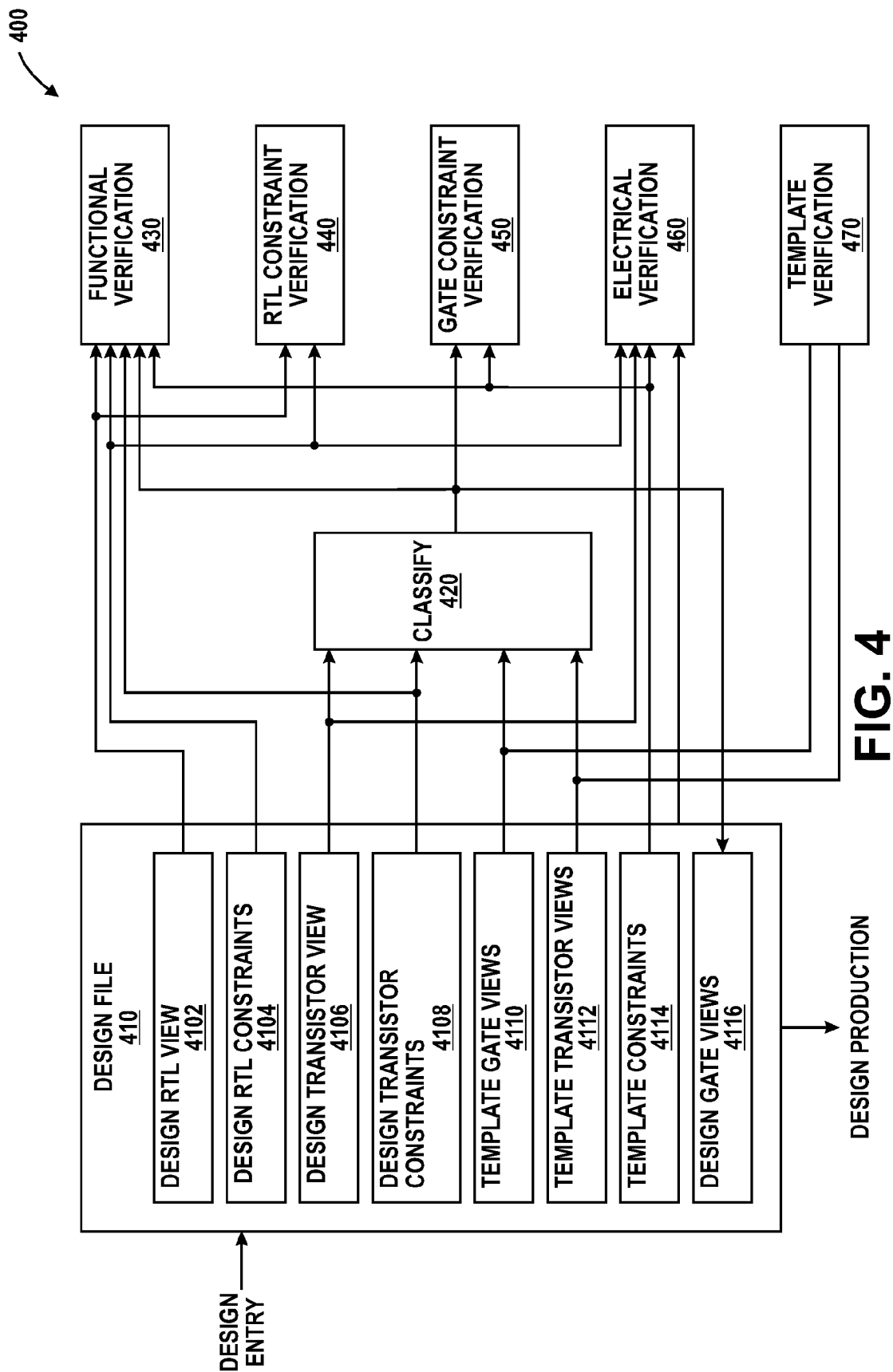
FIG. 4 is a block diagram illustrating an electronic device design system including computer-aided design applications in accordance with a specific embodiment of the present disclosure.

FIG. 4 is a block diagram illustrating an electronic device design system 400 including computer-aided design applications in accordance with a specific embodiment of the present disclosure. System 400 includes a design file 410, a classify procedure 420, a functional verification procedure 430, a RTL constraint verification procedure 440, a gate-level constraint verification procedure 450, an electrical verification procedure 460, and a template verification procedure 470. Design file 410 includes a design RTL representation 4102, design RTL constraints 4104, a design transistor-level representation 4106, design transistor-level constraints 4108, template library gate-level representations 4110, template library transistor-level representations 4112, template library constraints 4114, and a design gate-level representation 4116. The procedures 420, 430, 440, 450, 460, and 470, in one embodiment, are implemented as sets of instructions executed by one or more processors of the electronic device design system.

Design file 410 is configured to store attributes associated with an electronic device design. For example, a designer can use a design-entry tool such as a schematic editor to describe a transistor circuit that implements a portion of the electronic device design. Design file 410 has an application programming interface (API) to permit storing and accessing of design information. Design file 410 provides RTL representation 4102 to functional verification procedure 430 and RTL constraint verification procedure 440. Design file 410 also provides design RTL constraints 4104 to functional verification procedure 430, RTL constraint verification procedure 440, and electrical verification procedure 460. Design file 410 further provides transistor-level representation 4106 to classify procedure 420 and electrical verification procedure 460. Design file 410 also provides transistor-level constraints 4108 to classify procedure 420 and functional verification procedure 430.

Design file 410 provides template library gate-level representations 4110 and template library transistor-level representations 4112, respectively, to classify procedure 420 and template verification procedure 470. Design file 410 additionally provides template library constraints 4114 to functional verification procedure 430, gate-level constraint verification procedure 450, and electrical verification procedure 460. Design file 410 also provides additional device design information and attributes to electrical verification procedure 460. Design file 410 also has an API to provide production information to a manufacturing facility. Classify procedure 420 has an API to provide a gate-level representation 4116 of the electronic device design to design file 410, functional verification procedure 430, and gate-level constraint verification procedure 450.

Design file 410 represents one or more databases used for storing an electronic device design and associated attributes. Design file 410 can receive design-entry information from engineers and additional design properties and parameters from associated databases. Design file 410 can provide information to CAD procedures such as classify procedure 420, functional verification procedure 430, and the like. Additional CAD procedures (not shown) may receive information from design file 410 to perform or facilitate other design operations. As the electronic device design process progresses, design file 410 is updated to reflect updated electronic device design information. When the design process is complete, the information stored at design file 410 can be used for production of the electronic device. For example, physical photo-mask information can be provided by design file 410 to an integrated circuit fabrication facility.

Classify procedure 420 is configured to generate a gate-level representation of the design using templates as described with reference to block 112 at FIG. 1. Functional verification procedure 430 is configured to verify the equivalence of the gate level representation of the electronic device design and the RTL representation of the electronic device design as described with reference to block 114 at FIG. 1. RTL constraint verification procedure 440 is configured to verify that constraints associated with the RTL representation of the electronic device design are valid, and gate-level constraint verification procedure 450 verifies that constraints associated with the gate-level representation of the electronic device design (template constraints and constraints associated with the transistor-level representation of the electronic device design) are valid. RTL constraint verification procedure 440 and gate-level constraint verification procedure 450 are described with reference to block 120 at FIG. 1. Electrical verification procedure 460 is configured to verify that all electrical, timing and design-rule specifications are satisfied, as described with reference to block 126 at FIG. 1.

Figure 5:
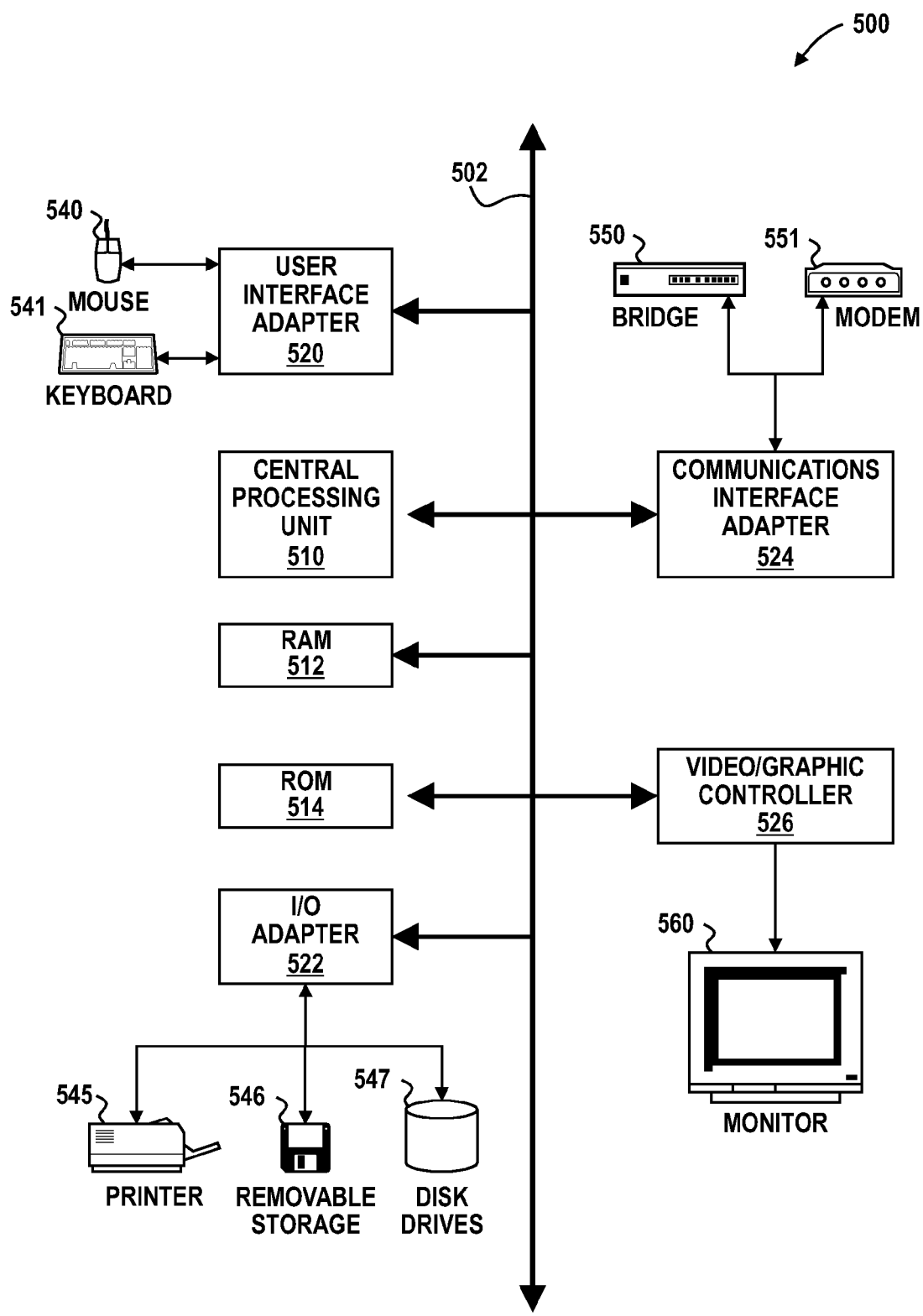
FIG. 5 is a diagram illustrating a processing device in the form of a computer system in accordance with a specific embodiment of the present disclosure.

FIG. 5 illustrates, in block diagram form, a processing device in the form of a computer system 500. Computer system 500 is illustrated to include devices connected to each other a central processing unit 510, which may be a conventional proprietary data processor, memory including a random access memory 512, a read only memory 514, and an input output adapter 522, a user interface adapter 520, a communications interface adapter 524, and a multimedia controller 526. Generally, system 500 will be capable of implementing the system and methods described herein. For example, design file 410 to be accessed and manipulated by the method described herein can be stored at disk drive 547 and accessed by the CPU 510 in response to an instruction.

Input output (I/O) adapter 522 is further connected to, and controls, disk drives 547, printer 545, removable storage devices 546, as well as other standard and proprietary I/O devices. User interface adapter 520 can be considered to be a specialized I/O adapter. Adapter 520 is illustrated to be connected to a mouse 540, and a keyboard 541. In addition, the user interface adapter 520 may be connected to other devices capable of providing various types of user control, such as touch screen devices. Communications interface adapter 524 is connected to a bridge 550 such as is associated with a local or a wide area network, and a modem 1051. System bus 502 can be connected to various communication devices to access external information. Multimedia controller 526 will generally include a video graphics controller capable of displaying images upon the monitor 560, as well as providing audio to external components (not illustrated).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    generating, using a computer, a template-level representation of an electronic device design based on a transistor-level representation of the electronic device design, the template-level representation comprising one or more hierarchies of templates, each template representing a corresponding portion of the electronic device design;
    receiving constraint declarations associated with the electronic device design, the constraint declarations including a first constraint declaration associated with a register-transfer-level (RTL) representation of the electronic device design and a second constraint declaration associated with at least one template of the one or more hierarchies of templates;
    verifying whether there is a functional equivalence between the template-level representation and the RTL representation of the electronic device design;
    verifying whether the constraint declarations are valid; and
    verifying the electronic device design responsive to verifying the functional equivalence and verifying the constraint declarations.

2. The method of claim 1, wherein verifying the electronic device design further comprises verifying the electronic device design responsive to verifying an electrical integrity of the electronic design.

3. The method of claim 1, wherein:
    verifying whether the constraint declarations are valid comprises:
    verifying whether the first constraint declaration is valid for the RTL representation; and
    verifying whether the second constraint declaration is valid for the at least one template.

4. The method of claim 1, wherein generating the template-level representation comprises:
    receiving a set of templates, each template representing a corresponding circuit portion;
    analyzing the transistor-level representation to identify a specified portion of the transistor-level representation having a structure equivalent to a template of the set of templates; and
    implementing the equivalent template in the template-level representation as a representation of the specified portion of the transistor-level representation.

5. The method of claim 4, wherein each template of the set of templates comprises a gate representation, a transistor-level representation, and template properties, wherein the template properties includes a constraint declaration and a functional description of the template.

6. The method of claim 5, further comprising verifying the functional equivalence of the transistor-level representation of the template and the functional description of the template.

7. The method of claim 4, wherein analyzing the transistor-level representation comprises identifying the equivalent template based on graph matching between the transistor-level representation and the set of templates.

8. The method of claim 1, wherein verifying the constraint declarations comprises verifying the first constraint declaration using at least one of an assertion-checking proof engine or an RTL logic simulator and corresponding test patterns.

9. The method of claim 1, wherein verifying the constraint declarations comprises verifying the second constraint declaration using at least one of an assertion-checking proof engine or a gate-level logic simulator and corresponding test patterns.

10. The method of claim 1, wherein the constraint declarations include at least one of a group consisting of:
    a constraint declaration to specify that signals at two or more nodes are mutually exclusive;
    a constraint declaration to specify that a signal of only one node of three or more nodes can be at a specified logic level at a particular time;
    a constraint declaration to specify that signals at two or more nodes are logically equivalent;
    a constraint declaration to specify that illegal states with reference to a group of signals at two or more nodes;
    a constraint declaration to specify legal states with reference to a group of signals at two or more nodes;
    a constraint declaration to specify that signals at two nets are not to transition to a specified logic level concurrently; and
    a constraint declaration to specify that one or more specified signal transition combinations are excluded.

11. A non-transitory computer readable medium embodying a software program, the software program comprising executable instructions configured to manipulate at least one processor to:
    generate a template-level representation of an electronic device design based on a transistor-level representation of the electronic device design, the template-level representation comprising one or more hierarchies of templates, each template representing a corresponding portion of the electronic device design;
    receive constraint declarations associated with the electronic device design, the constraint declarations including a first constraint declaration associated with a register-transfer-level (RTL) representation of the electronic device design and a second constraint declaration associated with at least one template of the one or more hierarchies of templates;
    verify whether there is a functional equivalence between the template-level representation to the RTL representation of the electronic device design;
    verify whether the constraint declarations are valid; and
    verify the electronic device design responsive to verifying the functional equivalence and verifying the constraint declarations.

12. The computer readable medium of claim 11, wherein the executable instructions configured to manipulate the at least one processor to verify the electronic device design comprise executable instructions configured to manipulate the at least one processor to verify the electronic device design responsive to verifying the electrical integrity of the electronic design.

13. The computer readable medium of claim 11, wherein:
    the executable instructions configured to manipulate the at least one processor to verify whether the constraint declarations are valid comprise executable instructions configured to manipulate the at least one processor to:
    verify whether the first constraint declaration is valid for the RTL representation; and verify whether the second constraint declaration is valid for the at least one template.

14. The computer readable medium of claim 11, wherein the executable instructions configured to manipulate the at least one processor to generate the template-level representation comprise executable instructions configured to manipulate the at least one processor to:
- receive a set of templates, each template representing a corresponding circuit portion;
- analyze the transistor-level representation to identify a specified portion of the transistor-level representation having a structure equivalent to a template of the set of templates; and
- implement the equivalent template in the template-level representation as a representation of the specified portion of the transistor-level representation.

15. The computer readable medium of claim 14, wherein each template of the set of templates comprises a gate representation, a transistor-level representation, and template properties, wherein the template properties includes a constraint declaration and a functional description for the template.

16. The computer readable medium of claim 15, further comprising executable instructions configured to manipulate the at least one processor to verify the functional equivalence of the transistor-level representation of the template and the functional description of the template.

17. The computer readable medium of claim 15, wherein the executable instructions configured to manipulate the at least one processor to analyze the transistor-level representation comprise executable instructions configured to manipulate the at least one processor to identify the equivalent template based on graph matching between the transistor-level representation and the set of templates.

18. The computer readable medium of claim 11, wherein the executable instructions configured to manipulate the at least one processor to verify the constraint declarations comprises executable instructions configured to manipulate the at least one processor to verify a constraint declaration associated with the RTL representation using at least one of an assertion-checking proof engine or an RTL logic simulator and corresponding test patterns.

19. The computer readable medium of claim 11, wherein the executable instructions configured to manipulate the at least one processor to verify the constraint declarations comprises executable instructions configured to manipulate the at least one processor to verify a constraint declaration associated with the template-level representation using at least one of an assertion-checking proof engine or a gate-level logic simulator and corresponding test patterns.

20. The computer readable medium of claim 11, wherein the constraint declarations include at least one of a group consisting of:
- a constraint declaration to specify that signals at two or more nodes are mutually exclusive;
- a constraint declaration to specify that that a signal of only one node of three or more nodes can be at a specified logic level at a particular time;
- a constraint declaration to specify that signals at two or more nodes are logically equivalent;
- a constraint declaration to specify that illegal states with reference to a group of signals at two or more nodes;
- a constraint declaration to specify legal states with reference to a group of signals at two or more nodes;
- a constraint declaration to specify that signals at two nets are not to transition to a specified logic level concurrently; and
- a constraint declaration to specify that one or more specified signal transition combinations are excluded.

* * * * *